United States Patent [19]

Ichikawa

[11] Patent Number: 5,719,448
[45] Date of Patent: Feb. 17, 1998

[54] BONDING PAD STRUCTURES FOR SEMICONDUCTOR INTEGRATED CIRCUITS

[75] Inventor: Matsuo Ichikawa, Suwa, Japan

[73] Assignee: Seiko Epson Corporation, Tokyo, Japan

[21] Appl. No.: 143,677

[22] Filed: Oct. 26, 1993

Related U.S. Application Data

[63] Continuation-in-part of Ser. No. 742,465, Aug. 5, 1991, abandoned, which is a continuation of Ser. No. 490,160, Mar. 6, 1990.

[30] Foreign Application Priority Data

Mar. 7, 1989 [JP] Japan ............................ 1-54223

[51] Int. Cl.$^6$ ............................ H01L 23/48; H01L 23/52; H01L 29/40
[52] U.S. Cl. ............................ 257/781; 257/780
[58] Field of Search ............................ 257/779, 780, 257/781, 768, 769, 764

[56] References Cited

U.S. PATENT DOCUMENTS 4,471,376  9/1984  Morcom et al.
4,824,830  4/1989  Us et al.
5,023,697  6/1991  Tsumura .................. 257/780
5,289,038  2/1994  Amano .................. 257/780

FOREIGN PATENT DOCUMENTS 61-170056  7/1986  Japan.
58-199533  11/1993  Japan.

OTHER PUBLICATIONS

"Hardness", Van Nostrand's Scientific Encyclopedia, vol. I, pp. 1403–1404 (19 ).
"Titanium", Van Norstrand's Scientific Encyclopedia, vol. II, pp. 2839–2841 (19 ).
*Western Tube v. Rainear*, 156 F. 49, 50 (E.D.Pa. 1907).

Primary Examiner—Mahshid D. Saadat
Assistant Examiner—S. V. Clark
Attorney, Agent, or Firm—W. Glen Johnson

[57] ABSTRACT

A bonding pad structure for a semiconductor integrated circuit permits miniaturization of the bonding pad size by utilizing an opening in an overlying insulating layer to an exposed surface of an underlying multi-layer, interconnecting wiring of the integrated circuit, constituting a bonding pad for exposure to wire bonding. As a result, miniaturization of bonding pad size can be accommodated with integrated circuit scale reduction while maintaining good bonding adhesion strength at the bonding pad for subsequent wiring bonding.

27 Claims, 5 Drawing Sheets

BONDING PAD STRUCTURES FOR SEMICONDUCTOR INTEGRATED CIRCUITS

REFERENCE TO RELATED APPLICATIONS

This application is a continuation-in-part of patent application Ser. No. 07/742,465, filed Aug. 5, 1991, now abandoned which is a continuation of patent application Ser. No. 07/490,160, filed Mar. 6, 1990.

BACKGROUND OF THE INVENTION

This invention relates generally to structures for bonding pads in a semiconductor integrated circuits and more particularly to bonding pad structures that alleviate the problem of poor wire bonding pad quality due to defacement or disfigurement of the pad by a measuring probe tip during automated testing of the IC circuit in the wafer stage, particularly where such boning pad structures have undergone miniaturization with semiconductor IC scale reduction.

Semiconductor IC structures and deuces have now advanced well into the age of small submicron dimension. As a result, the generation of mass produced DRAMs is cheung from the conventional 256K DRAM to the 1M DRAM. Prototypes and testing of a 4M DRAM have been completed and 4M DRAM are now in production and sale.

Relative to the innovation and development of DRAMs, there has been remarkable development in recent years in the process of manufacturing of semiconductor ICs, and their deuces and their circuitry. In particular, the development has rapidly advanced in recent years in the miniaturization of super fine, submicron IC structures with increased automation of their manufacturing process, including enhanced production techniques, such as, automated circuit testing and automated wire bonding.

Figure 6:
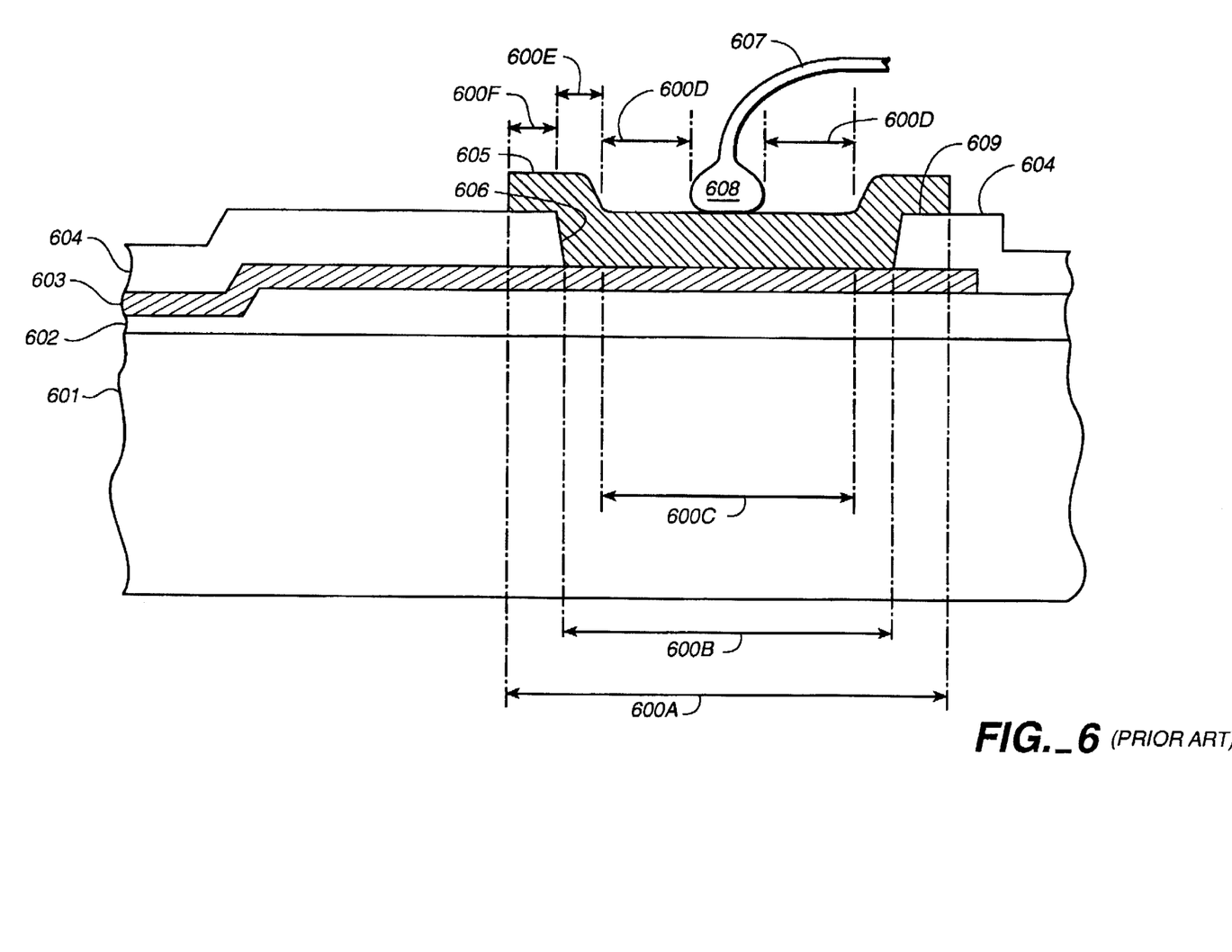
FIG. 6 is schematic sectional view illustrating a conventional, special type bonding pad for an IC circuit.

With respect to reduction of scale of such IC structures, however, the configuration and size of bonding pads to the outside world of the IC structure or device have made no substantial progress relative to reduction of bonding pad size or their miniaturization. It has been proposed that some IC structures be designed with double layered aluminum wires or interconnects in contrast with the passè approach that the bonding pads be constructed of a single top layer of aluminum upon which wiring bonding is performed. Current practice is that bonding pads in many cases be formed of a double layered aluminum construction and, in some special cases, the bonding pad is an aluminum pad layer formed over a refractory metal underlayer functioning as an interconnect. In this latter connection, see Japanese application publication No. 58-199533 to K. Yoshinaga, published Nov. 19, 1983. The bonding pad structure shown in this publication is also shown in FIG. 6 herein.

The typical aluminum bonding pad presents a classical problem which becomes more pronounced as the number of bonding pads in a given chip design is increased. Specifically, when automated measuring of or and testing for the electrical properties of the IC circuit components and circuits at the wafer stage is accomplished, via the formed aluminum bonding pads, the auto-aligned probe tip of the measuring device easily defaces or disfigures the pad aluminum pattern. Such disfigurement directly affects, in an adverse manner, the later resulting bonding properties between the bonding pad and its pressure bonded wire, depending on a degree of severity of the original defacement or disfigurement. Groups of such probe tips are carried by a probe card. The individual testing probes comprise horizontally, outwardly extended probe members that terminate in downwardly angled probe tips which concurrently engage a group of Al bonding pads formed on an IC die. The height and resiliency of the probes are adjusted to uniformly apply the same amount of pressure relative to each bonding pad. Testing is accomplished by, first, moving the horizontally disposed probe tip downwardly to bring their resilient probe tips into pressure engagement with selected Al bonding pads. Secondly, the probe card and, consequentially, the probe tips are moved in a direction of their angular disposition, i.e., in a horizontal direction on the Al bonding pads, a distance usually in the range of 10 µm to 30 µm. As a result, the end tips of the probes will literally dig into the Al metal to provide good electrical contact. This "dig in" action naturally causes removal of the pad Al metal resulting in the above mentioned disfigurement. Thus, it is necessary to attempt to control the pressure uniformly among a group of such automatically operated test probes as applied to a group of bonding pads to be tested. Moreover, there are times when the same Al bonding pads are consecutively contacted more than one time during IC manufacture by a test probe to provide for continuous checking of IC circuit integrity. This continual testing only enhances the problem of bonding pad disfigurement.

Figure 5A:
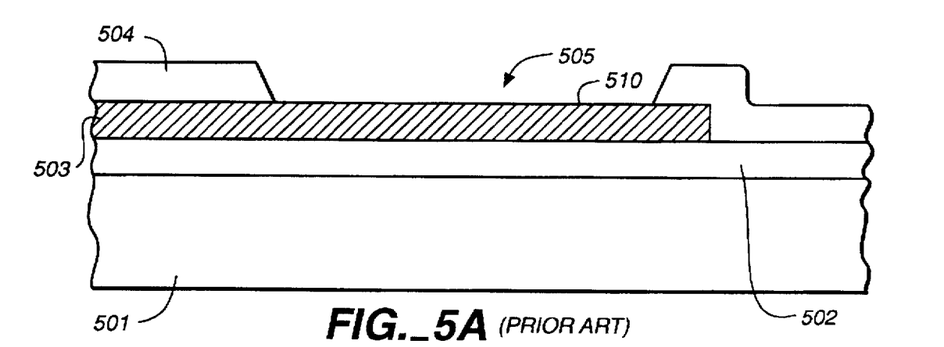
FIGS. 5A–5C are schematic sectional views illustrating a conventional bonding pad for an IC circuit, illustrating the occurrence of defacement or disfigurement of the bonding pad surface, and resulting wiring bonding problems in conjunction with the bonding pad as explained in the background of the invention.
Figure 5B:
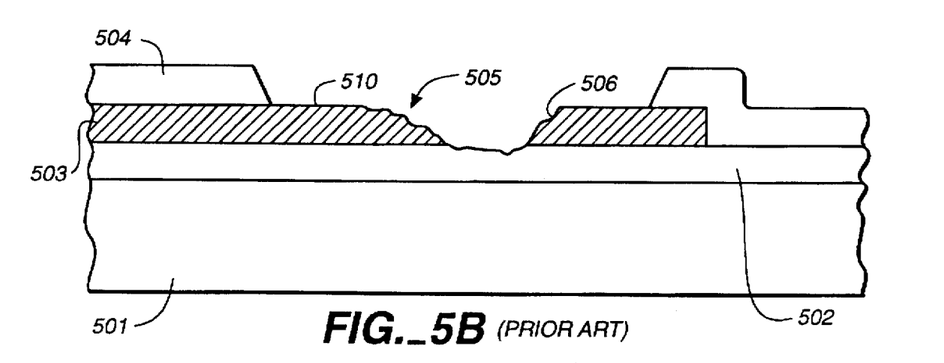
Figure 5C:
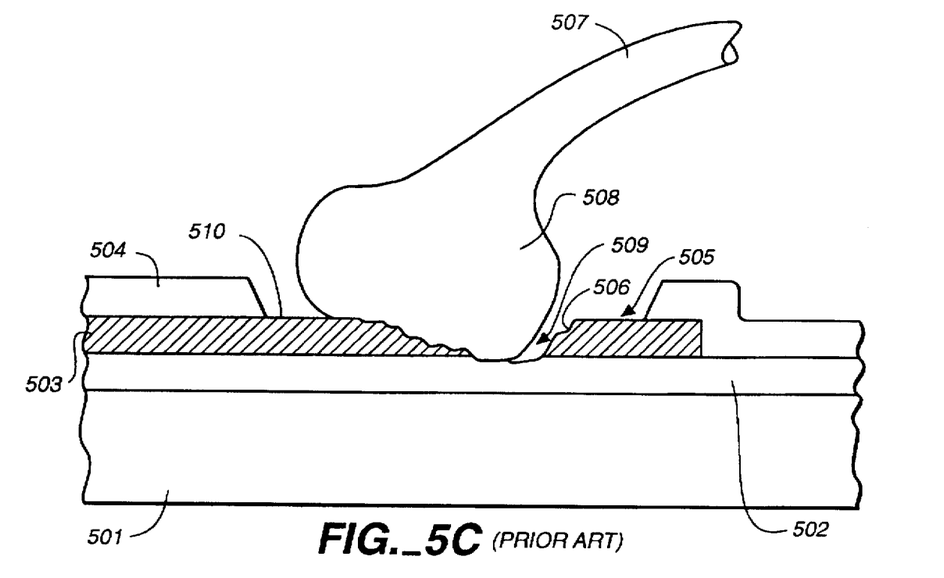

The foregoing problem of bonding pad disfigurement is explained now in greater detail with reference to FIGS. 5A–5C.

FIG. 5A depicts a conventional Al bonding pad structure as currently employed. As shown in FIG. 5A, aluminum wire or interconnect 503 is formed on insulating film 502, which is, itself, formed on monocrystalline Si substrate 501 of an IC circuit. Passivation or insulating film 504 is thereafter formed on aluminum interconnect 503. Then, a bonding pad is formed by the removal of a selected region of insulating film 504 producing an exposed region resulting in bonding pad 505. When a resilient probe tip, as explained above, is employed to test and measure the characteristics of the IC circuit, via contact with bonding pad 505, a disfigurement 506 occurs to the exposed aluminum surface 510, as illustrated in FIG. 5B, due to the "dig in" function of the probe tip. This disfigurement can be about 10 µm to 30 µm long, approximating the distance of probe movement. The degree of disfigurement is proportional to the intensity of the pressure employed in automated alignment and the angular contact of the test probe tip with bonding pad 505 to provide good electrical contact. If the probe pressure is intense, the probe tip will create irregular recess 506 in the aluminum surface 510 of bonding pad 505, as illustrated in FIG. 5B. If the probe pressure is not sufficiently intense, good electrical contact cannot be achieved resulting in unreliable testing results. In many cases, the probe can penetrate to and expose underlying insulating film 502, as depicted in FIG. 5B.

As shown in FIG. 5C, when the IC chips undergo dicing and, then, wire bonding using bonding wire 507 is performed relative to bonding pad 505 at the time of IC packaging, good adherence of bonding ball 508 is difficult, as indicated by lack of complete integral contact at 509 between bonding ball 508 and Al surface 510. This stems from previous removal of a portion of the aluminum surface 510 of bonding pad 505 by engagement of the automated probe tip during die circuit testing. This is particularly true as the size of recess 506 is made larger due to probe tip pressure during automated alignment and probe tip contact with pad 505. As a result, a detrimental decrease in bonding adhesion occurs and bonded wire ball 508 does not remain secured and/or does not have good physical and electrical connecting properties to bonding pad 505, as depicted at 509 in FIG. 5C. More particularly, where the bonding pad is flawed to the point of exposure of underlying insulating film 502, the film does not pressure bond or fuse to this film so that a good mechanical bond cannot be established between bonding ball 508 and bonding pad 510. As a result, there is insufficient bonding adhesion strength for ball 508 so that it will likely not remain intact, and, moreover, it does not provide for good electrical contact to pad 510. It is important to maintain good bonding adhesion strength; otherwise, later operating circuit integrity will not be assured.

With a trend toward IC scale reduction, a reduction of pad size for bonding pad 510 will naturally result in an decrease in the area for ball bonding so that, if such miniaturization is accompanied with probe testing, mechanical bonding adhesion strength will correspondingly further deteriorate due to reduced bonding pad area for the given bonding ball size and pattern of bonding pad disfigurement.

Thus, a primary object of this invention is provision for miniaturization of bonding pads while improving the mechanical bonding adhesion strength between the bonding ball and the metal bonding pad.

FIG. 6 shows a conventional configuration employed in utilizing an exposed surface aluminum film as a bonding pad, which is a special kind of bonding pad for metal oxide gate electrode structures. In FIG. 6, a thin $SiO_2$ film 602 is deposited on a silicon substrate 601 and a refractory metal layer 603 is formed on insulating film 602. A second insulating layer 604 is then formed over refractory metal layer 603 and opening 606 is formed in insulating layer 604 followed by the formation of aluminum bonding pad 605 which extends into opening 606 and overlaps adjacent edges at 609 of opening 606. Wiring bonding is performed using conventional ball bonding wherein the formed wire bonding ball 608 of bonding wire 607, e.g., a 25 μm diameter Au wire, is formed an connected to Al pad 605 by means capillary pressure or hot pressure adhesion. A part of the Au wiring may pass through Al layer 605 and contact the underlying refractory metal layer 603 providing for smaller contact resistance by generating eutectic crystals between the Au, or Al, and the refractory metal.

Opening 606 may have a diameter 600B of about 94 μm while Al pad 605 is provided a diameter 600A of about 100 μm to accommodate bonding ball 608, which may have a body diameter 600C of about 80 μm. The edge overlap 609 may have dimensions indicated at 600E and 600F of about 4 to 5 μm on each side. Dimensions 600E and 600F represent an overlap area of the separately deposited Al bonding pad wherein no wire bonding function takes place. The required alignment margin 600D around bonding ball 608 has to be about 5 μm to accommodate the bonding tool. Thus, Al pad 605 has to be made sufficiently wide at 600A, i.e., at least 98 μm, to accommodate automated bonding tool alignment and the formation of bonding ball 608.

Moreover, the bonding pad structure of FIG. 6 with its Al bonding pad structure overlapping the formed opening does not lend itself to efficient miniaturization with integrated circuit scale reduction. Also, the surface Al pad, being exposed on the upper surface of the semiconductor structure at the fabrication stage as shown in FIG. 6, is subject to be easily damaged.

Thus, a primary object of this invention is provision for miniaturization of bonding pads while maintaining the mechanical bonding adhesion strength between the bonding ball and the metal bonding pad.

As previously indicated, if the measurement probe tip pressure is too intensive, or if the probe tip is partially protruding into the Al layer, when measuring the electric characteristics at the wafer stage of fabrication, the aluminum pattern of the pad units is easily disfigured by the probe tip and, as a result, bonding properties of the bonding pad will be deteriorated and the resultant bonding adhesion quality will be reduced. In particular, if the number of I/O terminals increases in connection with the employment of a large size IC chip or a reduction in integrated circuit scale is accomplished requiring further miniaturization of the bonding pads, the probability of pad deterioration correspondingly increases, due to required finer alignment of the probing tip and removal of Al surface material with smaller size bonding pads due to smaller integrated circuit scale. In other words, the disfigurement of the pad surface is more serious problem for good bonding wire adhesion if the pad surface is also made smaller. Thus, good bonding contact becomes more critical in IC fabrication of large IC chips and/or IC chip miniaturization.

SUMMARY OF THE INVENTION

According to this invention, obviation of the foregoing problems is achieved in terms of reduced integrated circuit scale and corresponding bonding pad miniaturization when circuit probe testing is utilized in IC manufacture by:

(1) providing a multi-layer, interconnecting wiring underlying a passivation or insulating layer comprising an upper Al interconnect layer and an adjacent lower refractory metal interconnect layer;

(2) optimizing the multi-layer, interconnecting wiring thickness ratio between the film thickness of the upper soft metal, e.g., Al, interconnect layer and the film thickness of the lower hard metal, e.g., refractory metal, interconnect layer;

(3) providing an exposed region through the passivation layer to form a bonding pad comprising a surface region of the multi-layer, interconnecting wiring;

(4) controlling the formed size of the disfigurement caused by the probe tip used in circuit testing, particularly toward reduction in integrated circuit scale or IC miniaturization;

(5) controlling the size of the ball formed during wire bonding, particularly toward reduction in integrated circuit scale or IC miniaturization; and (6) controlling the size of the formed bonding pad, taking into consideration the bonding ball size and required tool alignment margin, particularly toward reduction in integrated circuit scale or IC miniaturization.

Mechanical strength, and, correspondingly, electrical contact properties, of a wire bonded bonding pad are improved, while permitting smaller bonding pad size, by providing a metal bonding pad formed in an overlying insulating layer and the bonding pad having a bottom, exposed contact surface comprising a multi-layer, interconnecting wiring, underlying the insulating layer, comprising an upper soft metal or Al interconnect layer and a lower hard metal or refractory metal interconnect layer. Thus, even if the bonding pad is disfigured due to testing probe "dig-in" contact, it is possible to achieve bonding pad miniaturization while maintaining or improving mechanical bonding adhesion strength by the provision of a buried multi-layer wiring interconnect structure. The employment of the buried multi-layer interconnect wiring structure permits the accomplishment of bonding pad miniaturization without deterioration of mechanical bonding adhesion strength because of the presence of the lower hard metal layer of the wiring interconnect. Even if the contact area of the upper softer metal layer is disfigured due to probe testing, the exposure of the lower harder metal layer provides or the maintenance of the required high degree of adhesion strength in the bonding process. While such soft metal/hard metal multi-layer metals are known and have been employed extensively in IC fabrication, their utility relative to bonding pad miniaturization has not been realized or appreciated.

Thus, according to the present invention, the interconnect wiring underlying the passivation or insulation layer itself constitutes the bonding wire bonding pad, eliminating any need for a separate pad layer, such as shown in FIG. 6 at 705, and an extra process step for its fabrication. Moreover, the present invention eliminates the need for dealing with the stop formed in the Al bonding pad 705 in FIG. 6 formed by contact hole and the upper surface of passivation layer 704 thereby utilizing smaller bonding pad areas. The structure of FIG. 6 is not suitable for miniaturization because of the required bonding pad overlap of the insulating layer.

According to this invention, a semiconductor integrated circuit device comprises multi-layer, interconnecting wiring functioning as a circuit interconnect and, moreover, openings or holes formed through an overlying insulating layer to surface regions of the wiring, which surface regions constitute bonding pads. Bonding pads formed from the interconnect layer it-self permit a corresponding miniaturization in pad size with reduce integrated circuit scale. The multi-metal layer, comprises an upper interconnect layer of aluminum or aluminum alloy film, which provides an exposed bonding pad surface in a formed bonding pad hole, and an underlying or lower interconnect layer of at least one or more refractory metal layers, or refractory metal compound layers or combination of such refractory metal layers and refractory metal compound layers formed fully along the length or significant portion of the length of the overlying aluminum or aluminum alloy film inclusive of the bonding pad holes. Alternatively, a copper layer may be employed as the lower interconnect layer.

Since adherence properties between Al and refractory metal layers is not too strong, it is desirable that the Al and refractory metal layers be in contiguous contact for a significant length beyond the exposed bonding pad holes formed through the overlying insulating layer in order to improve the reliability of the multi-interconnect layer. Thus, the formed bonding pads with a double layer bottom surface provide good bonding adhesion strength for subsequent wire bonding and packaging.

Since the exposed surface of the multi-interconnect layer per se forms the bonding pad, control of the size of the bonding pad openings, the size of the bonding wire ball as well as the extent of the upper interconnect layer disfigurement can be together regulated to permit smaller integrated circuit scale in spite of testing probe damage to the surface of the upper Al interconnect layer exposed in the bonding pad openings.

Other objects and attainments together with a fuller understanding of the invention will become apparent and appreciated by referring to the following description and claims taken in conjunction with the accompanying drawings.

DESCRIPTION OF THE PREFERRED EMBODIMENTS

This invention will be explained in connection with several embodiments relative to an bonding pad formed in connection with a thin film transistor or a contact region in a semiconductor substrate as part of an IC structure. However, the structure of these embodiments may also be employed as to bonding pad in any other type of IC chip design. Also, damage or disfigurement to the upper metal layer of the bonding pads due to probe testing is not illustrated for the purposes of clarity. In such cases, the upper Al layer at the surface region of the bonding pad may be removed to the surface of the underlying refractory metal layer.

Figure 1A:
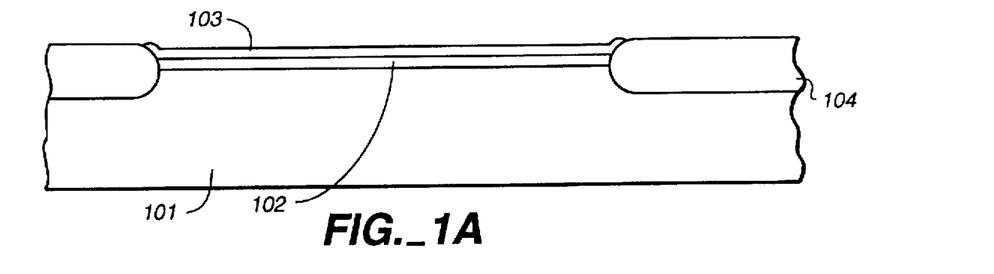
FIGS. 1A–1D are schematic sectional views illustrating the steps of fabrication of an bonding pad comprising a first embodiment of this invention as employed in conjunction with a semiconductor transistor structure constituting a portion of an integrated circuit.

Reference is now made to the first embodiment of this invention as disclosed in FIGS. 1A to 1D. As illustrated in FIG. 1A, after formation of pad oxide film 102 on p-type monocrystalline Si 101, a silicon nitride mask 103 is formed on film 102 and then a selective oxidation is performed on substrate 101 to form LOCOS film 104.

Figure 1B:
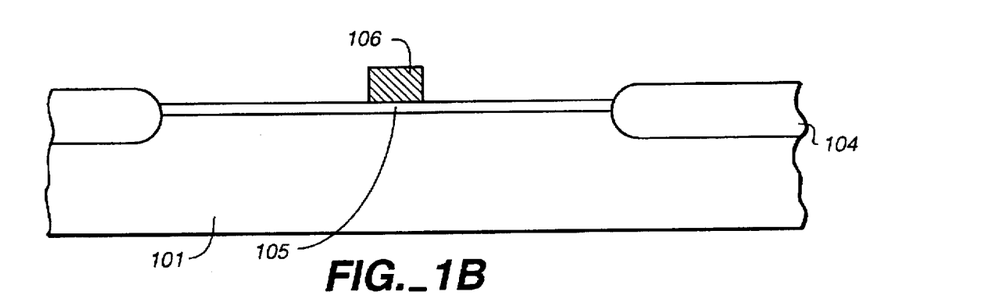

As illustrated in FIG. 1B, after removing silicon nitride film 103 and pad oxide film 102 employing etching, gate oxide film 105 is formed. Then, a polycrystalline silicon film is formed on gate oxide film 105 and is subjected to an $n^+$ diffusion. The $n^+$ diffused polycrystalline silicon film is thereafter selectively etched forming gate electrode 106 as shown in FIG. 1B.

Figure 1C:
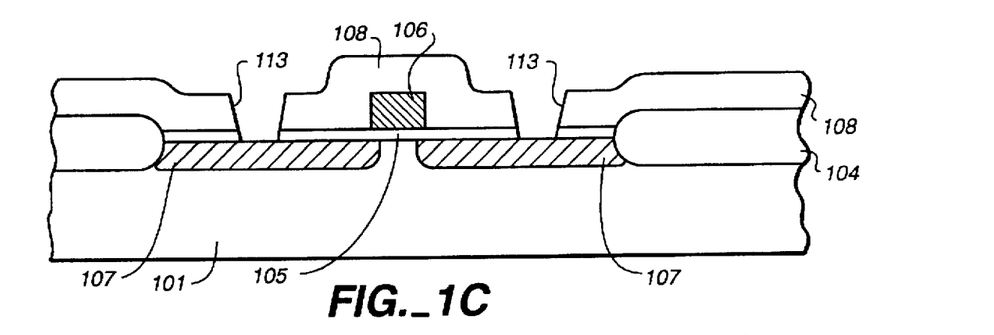

Next, $n^+$ diffused regions 107 are formed by ion implantation to provide a source and a drain, as shown in FIG. 1C. Then, interlayer insulating film 108 is formed on $n^+$ diffused regions 107 and film 108 is thereafter selectively etched to form contact holes 113.

Figure 1D:
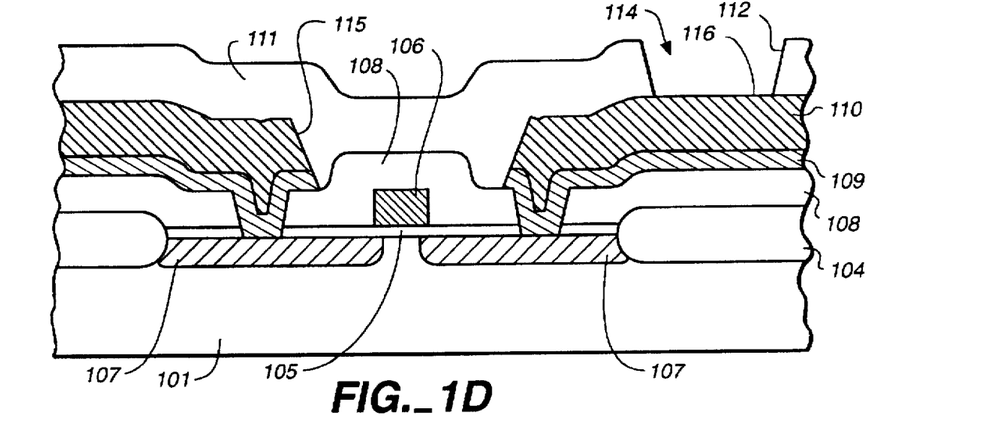

As shown in FIG. 1D, a multi-layer, interconnecting wiring is formed comprising refractory metal film 109 is deposited having a thickness in the range of about 100 Å to 3,000 Å. Film 109 in this embodiment, as well as refractory type films in subsequent embodiments, may be comprised of a refractory metal, such as, Mo, W, Cu, Ti, Ta, Pt or a refractory metal compound film of $MoSi_2$, $WSi_2$, CuSi, TiSi, PtSi, or TiN or a combination of such films. Alternatively, a copper film may be used in place of the refractory film.

The deposited refractory film is followed by the deposition of aluminum or aluminum alloy film 110 having a thickness in the range of about 5,000 Å through 15,000 Å. In the case of an aluminum alloy film, the alloys presently employed are an aluminum/silicon alloy and an aluminum/ silicon/copper alloy. Next, a selective etch is performed at region 115 for forming source and drain interconnects followed by the deposition of passivation film 111. Lastly, selective etching is performed on film 111 to create a bonding pad hole 112 forming bonding pad 114 including a pad surface 116 for wiring bonding. Thus, bonding pad 114 includes a double layered film comprising refractory metal film 109 formed beneath aluminum film 110.

In connection with the embodiment of FIG. 1, alternatively film 109 may be a copper film forming a double layered bonding pad 114 comprising a copper film formed beneath aluminum film 110.

Reference is now made to the second embodiment of this invention as disclosed in FIGS. 2A to 2D. As illustration in FIG. 2A, after formation of pad oxide film 202 on p-type monocrystalline Si 201, a silicon nitride mask 203 is formed on film 202 and then a selective oxidation is performed on substrate 201 to form LOCOS film 204.

Figure 2A:
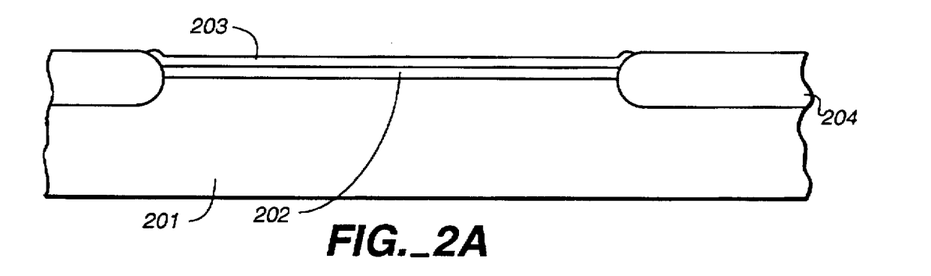
FIGS. 2A–2D are schematic sectional views illustrating the steps of fabrication of an bonding pad comprising a second embodiment of this invention as employed in conjunction with a semiconductor transistor structure constituting a portion of an integrated circuit.
Figure 2B:
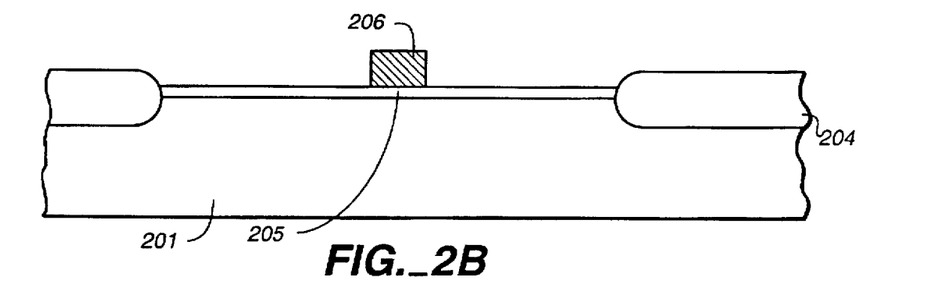

As illustrated in FIG. 2B, after removing silicon nitride film 203 and pad oxide film 202 employing etching, gate oxide film 205 is formed. Then, a polycrystalline silicon film is formed on gate oxide film 205 and is subjected to an $n^+$ diffusion. The $n^+$ diffused polycrystalline silicon film is thereafter selectively etched forming gate electrode 206 as shown in FIG. 2B.

Figure 2C:
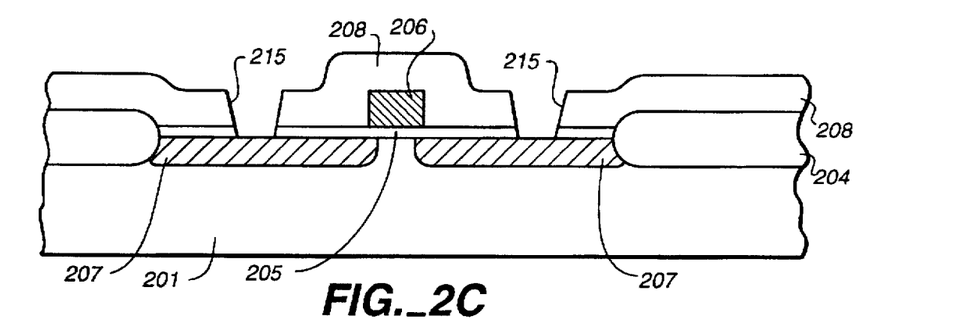

Next, $n^+$ diffused regions 207 are formed by ion implantation to provide a source and a drain, as shown in FIG. 2C. Then, interlayer insulating film 208 is formed on $n^+$ diffused regions 207 and film 208 is thereafter selectively etched to form contact holes 215.

Figure 2D:
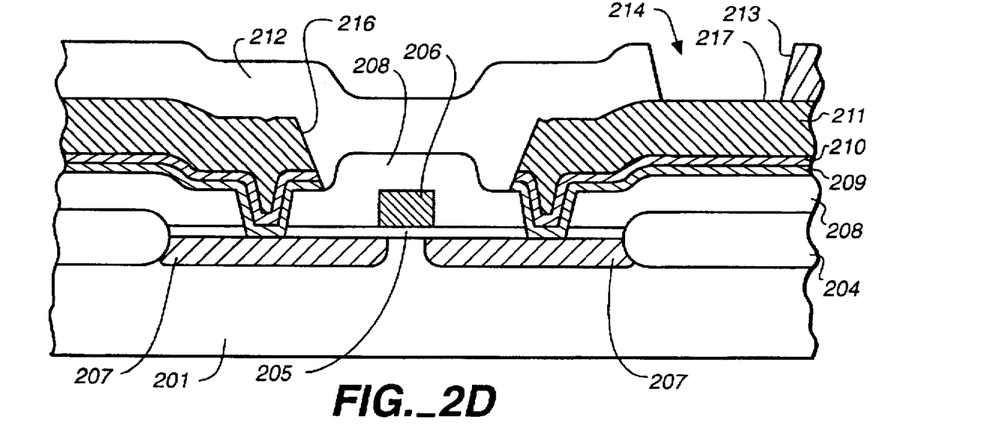

As shown in FIG. 2D, a multi-layer, interconnecting wiring is formed comprising refractory metal film 209 and refractory metal compound film 210 are sequentially deposited having a thickness in the range of about 100 Å to 3,000 Å, respectively. This is followed by the deposition of aluminum or aluminum alloy film 211 having a thickness in the range of about 5,000 Å through 15,000 Å. Next, a selective etch is performed at region 216 for forming source and drain interconnects followed by the deposition of passivation film 212. Lastly, selective etching is performed on film 212 to create a bonding pad hole 213 forming bonding pad 214 including a pad surface 217 for wiring bonding. Thus, bonding pad 214 includes a triple layered film comprising refractory films 209 and 210 formed beneath aluminum film 211.

Figure 3:
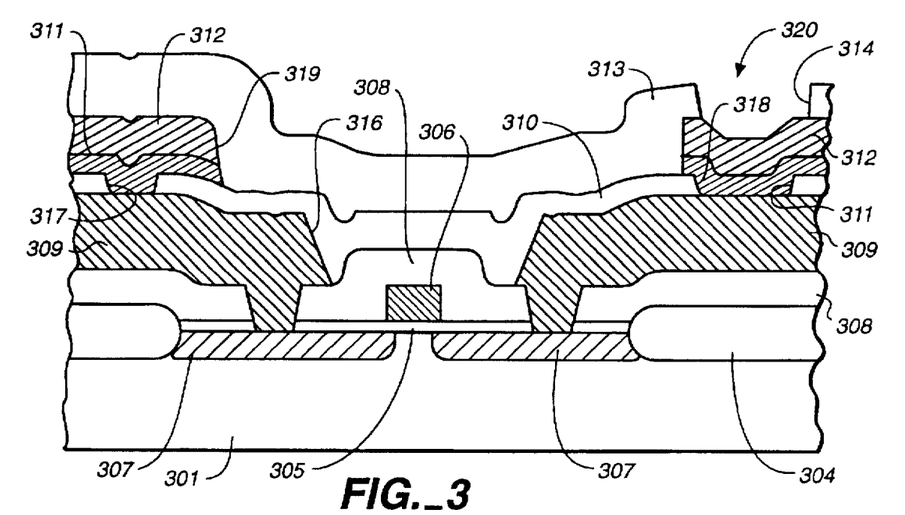
FIG. 3 is schematic sectional view illustrating an bonding pad comprising a third embodiment of this invention as employed in conjunction with a semiconductor transistor structure constituting a portion of an integrated circuit.

Reference is now made to the third embodiment of this invention as disclosed in FIG. 3. As in previous embodiments, a selective oxidation is performed on substrate 301 to form LOCOS film 304 followed with the formation of gate oxide film 305. Then, a polycrystalline silicon film is formed on gate oxide film 305 and is subjected to an $n^+$ diffusion. The $n^+$ diffused polycrystalline silicon film is thereafter selectively etched to form gate electrode 306.

Next, $n^+$ diffused regions 307 are formed by ion implantation constituting source/drain regions 307 a self-aligned manner. Interlayer insulating film 308 is then formed on $n^+$ diffused regions 307 and thereafter selectively etched to form contact holes 315.

Aluminum or aluminum alloy film 309 is next deposited on insulating layer 308 and in contact holes 305. Film 309 has a thickness in the range of about 1,000 Å through 8,000 Å. Next, a selective etch is performed in film 309 forming region 316 producing separate source/drain interconnects. This is followed by the deposition of interlayer insulating film 310. Then, contact openings 317 and 318 are formed in interlayer insulating film 310.

Next, a multi-layer, interconnecting wiring is formed comprising refractory metal film or refractory metal compound film 311, or a combination layer of a refractory metal film and refractory metal compound film, is deposited having a thickness in the range of about 100 Å to 3000 Å, followed by the deposition of aluminum or aluminum alloy film 312 having a thickness in the range of about 4,000 Å through 12,000 Å. This is followed by selective etching to remove portions of both metal films 311 and 312, indicated at 319 to provide separate interconnect integrity, followed by the deposition of passivation insulating film 313. Lastly, a selective etching is performed on film 313 to create to create a bonding pad hole 314 forming bonding pad 320 including a pad surface 322 for wiring bonding. Thus, bonding pad 320 includes a triple layered film comprising refractory metal film 311, which is formed between aluminum film 309 below and aluminum film 312 above refractory film 311. This Al/refractory metal/Al combination provides for improved bonding strength between the Al layers.

Figure 4:
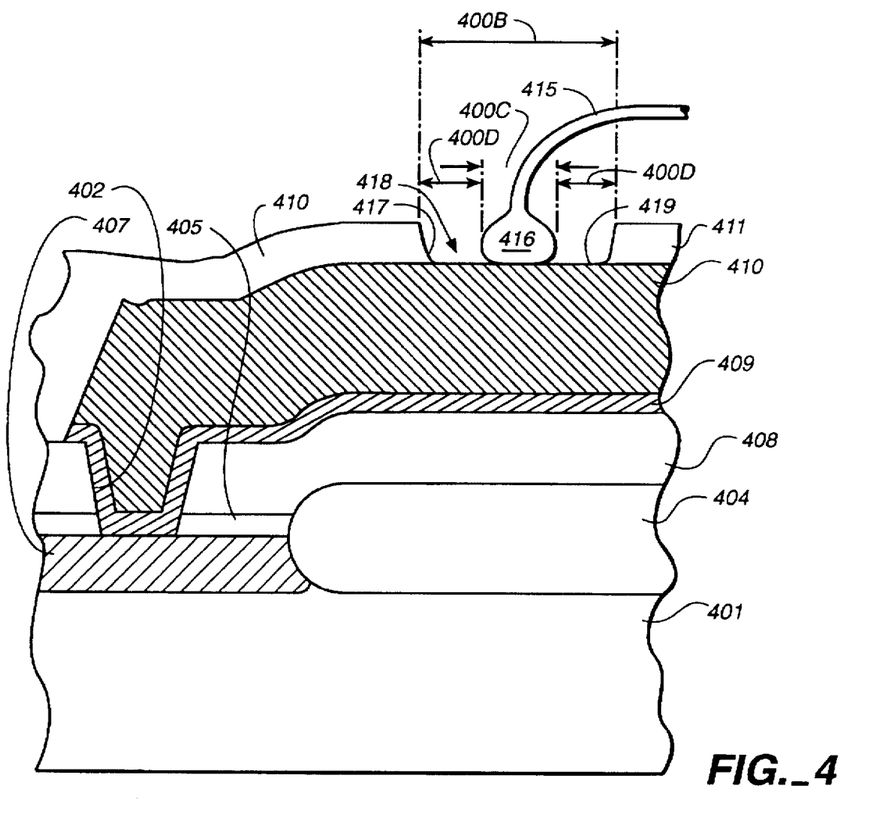
FIG. 4 is a schematic sectional view illustrating an bonding pad comprising a fourth embodiment of this invention as employed in conjunction with a semiconductor structure constituting a portion of an integrated circuit.

Reference is now made to a fourth embodiment of this invention as disclosed in FIG. 4. As illustrated in FIG. 4, after formation of pad oxide film on p-type monocrystalline silicon substrate 401, as in the case of previous embodiments, a silicon nitride mask is formed on the oxide film and, then, a selective oxidation is performed on substrate 401 forming LOCOS film 404. After removing the silicon nitride mask and the pad oxide film by means of etching, thin oxide film 405 is formed. Next, a $n^+$ diffusion is performed by ion implantation to provide a diffused contact region 407 in substrate 401. This is followed by deposition of interlayer insulating film 408 on oxide film 405 and LOCOS 404. Contact hole 402 is then selectively etched in both oxide film 405 and interlayer insulating film 408.

Next, a multi-layer, interconnecting wiring comprising a refractory metal layer or refractory metal compound layer 409, or a combination layer of a refractory metal film and refractory metal compound film, is deposited having a thickness in the range of about 500 Å to 2000 Å, followed by the deposition of aluminum or aluminum alloy film 410 having a thickness in the range of about 5,000 Å to 12,000 Å. This multi-layer, interconnecting wiring covers interlayer insulating layer 408 and fills contact hole 402 to region 407. This is followed by the deposition of passivation layer 411. Lastly, a selective etching is performed on layer 411 to create a bonding pad hole 417, having a diameter 400B of about 90 μm, forming bonding pad 418 including an exposed pad surface 419 for wiring bonding connection. Thus, bonding pad 418 includes pad hole 417 and multi-layer, interconnecting wiring comprising aluminum layer 410 and refractory metal layer 409.

Ball bonding is performed with bonding wire 415, e.g., a gold plated wire, creating a bonding ball 416 in pressure contact with Al pad surface 419. Wire 415 has about a 25 μm diameter and finished bonding ball 416 will having a body width 400C of about 80 μm. In order to achieve good automated alignment of the 25 μm bonding wire relative to the 90 μm pad hole 417 on an insured basis, a 5 μm alignment margin at 400D is necessary around bonding ball 416. In particular, with a bonding wire of about 25 μm, the bonding ball body width 400C may be vary within the range of 60 μm to 100 μm plus the alignment margin 400D on either side of ball 416 and, accordingly, the size of bonding pad hole 417 may be miniaturized as required.

In relation to the conventional bonding pad structure shown in FIG. 6, the bonding pad dimension 600A is about 100 μm, whereas in the FIG. 4 embodiment of this invention, bonding pad dimension 400B is about 90 μm wherein, in both cases, a 80 μm bonding ball (dimension 400C in FIG. 4 and dimension 600C in FIG. 6) is provided with alignment margin, respectively, 400D and 600D, a margin total of 10 μm. Thus, bonding pad hole 419 permits the use of a smaller dimension of about 10% reduction in the size of the necessary area for the bonding pad (90 μm bonding hole=80 μm bonding ball+10 μm alignment margin, versus, 100 μm bonding hole=80 μm bonding ball+10 μm alignment margin+10 μm pad margin).

In another example, if the bonding ball width, 400C, is 60 μm, opening width 400B required for accommodating of this ball size, with total appropriate alignment margin of 10 μm is 70 μm. On the other hand, in FIG. 6, the opening width 600B would have to be 80 μm (80 μm bonding hole=60 μm bonding ball+10 μm alignment margin+10 μm pad margin). This is about a 12.5% decrease in pad size over the conventional pad of FIG. 6.

The conventional pad in FIG. 6 includes dimensions 600E and 600F which cannot be reduced and, therefore, remain substantially the same. Thus, the bonding pad hole arrangement of this invention provides for a significant reduction in bonding pad size while accommodating alignment margins permitting miniaturization in pad size with reduction in channel length scale, such as, from 0.8 μm to 0.5 μm while maintaining the appropriate bonding ball dimensions as well as required tool alignment margins for the automated ball bonding tool.

In connection with the several foregoing embodiments, the upper Al layer is always thicker than the underlying refractory metal layer. The ratio of Al layer thickness to refractory metal layer thickness can generally be in the range of about 50 to 7.5, but is preferably in the range of about 10 to 5.

Also, it is well known that the adhesion between Al and refractory metal layers can be insufficient, particularly, in cases where their application is of small dimension. However, in the utility of the invention of this application, the exposure of the bonding pad is in a region of these layers lying beneath an insulating layer, i.e., neither of these dual layers are surface exposed and are not of short length. Moreover, the adhesion of these dual layers is improved during their fabrication by (1) initial sputtering of the refractory layer in vacuum followed by the formation of the Al layer without breaking vacuum or (2) initial sputtering of the refractory layer in vacuum, followed by removal of any formed oxide layer on the refractory metal film, which is followed by the formation of the Al layer or (3) initial sputtering of the refractory layer in vacuum followed by toughening of the refractory metal surface by ion bombardment, e.g., with Ar$^+$ ion bombardment, followed by the formation of the Al layer.

With the employment of a refractory metal or metal compound layer or laminated layers thereof, even if the probe tip of a circuit measuring system defaces or disfigures the aluminum layer of an bonding pad during circuit testing in the wafer stage of fabrication, there remains the resilient and strong refractory metal layer, refractory metal compound layer or laminated aluminum/refractory layers thereof. As a result, there is no deterioration of the bonding condition and high level adhesion of a bonded wire to the pad can be achieved. Further, good bonding properties are achieved even with a reduction in the size of the bonding pads and an increase in the number or density of I/O bonding pads in spite of any disfigurement caused by probe testing.

While the invention has been described in conjunction with several specific embodiments, it is evident to those skilled in the art that many further alternatives, modifications and variations will be apparent in light of the forgoing description. For example, a plurality of thin alternating aluminum and refractory metal or refractory metal compound films or layers may be utilized as a multiple composite interconnect layer with an overlying insulating layer through which bonding pad holes are formed. Thus, the invention described herein is intended to embrace at such alternatives, modifications, applications and variations as fall within the spirit and scope of the appended claims.

What is claimed is:

1. A bonding pad structure for receiving and electrically connecting an external bonding conductor to a contact area of a circuit element formed on a substrate of a semiconductor integrated circuit, comprising:

a first insulating layer patterned over the semiconductor integrated circuit substrate surrounding the circuit element contact area;

a hard metal conductive layer formed directly on said first insulating layer and electrically connected to the circuit element contact area, said hard metal layer having a substantially uniform, predetermined thickness;

a soft metal conductive layer formed on and extending contiguously with said hard metal conductive layer and electrically connected to the circuit element contact area via said hard metal conductive layer said soft metal conductive layer having a relative thickness at least 1.5 times greater than the predetermined thickness of said hard metal conductive layer; and a second insulating layer patterned over said soft metal conductive layer, said second insulating layer defining an opening terminating at an upper surface of said soft metal conductive layer for receiving the external bonding conductor, wherein the external bonding conductor directly bonds to at least one of said hard metal and soft metal conductive layers and electrically connects with the circuit element contact area even when said soft metal conductive layer has been deformed during testing.

2. The bonding pad structure of claim 1, wherein said soft metal conductive layer comprises an aluminum film having a thickness ranging from approximately 5000 to 15,000 Angstroms; and wherein said hard metal conductive layer has a thickness ranging from approximately 100 to 3000 Angstroms.

3. The bonding pad structure of claim 1, wherein said soft metal conductive layer comprises an aluminum film.

4. The bonding pad structure of claim 1, wherein said soft metal conductive layer comprises an aluminum alloy film.

5. The bonding pad structure of claim 1, wherein said hard metal layer comprises a refractory film selected from the group consisting of Mo, W, Cu, Ti, Ta, Pt, $MoSi_2$, $WSi_2$, CuSi, TiSi, PtSi, and TiN.

6. A bonding pad structure for receiving and electrically connecting an external bonding conductor to a contact area of a circuit element formed on a substrate of a semiconductor integrated circuit, comprising:

a first insulating layer patterned over the semiconductor integrated circuit substrate surrounding the circuit element contact area;

a hard metal conductive layer formed directly on said first insulating layer and electrically connected to the circuit element contact area, said hard metal layer comprising:

a refractory metal film selected from the group consisting of Mo, W, Cu, Ti, Ta, and Pt; and a refractory metal compound film selected from the group consisting of $MoSi_2$, $WSi_2$, CuSi, TiSi, PtSi, and TiN;

a soft metal conductive layer formed on and extending contiguously with said hard metal conductive layer and electrically connected to the circuit element contact area via said hard metal conductive layer; and a second insulating layer patterned over said soft metal conductive layer, said second insulating layer defining an opening terminating at an upper surface of said soft metal conductive layer for receiving the external bonding conductor, wherein the external bonding conductor directly bonds to at least one of said hard metal and soft metal conductive layers and electrically connects with the circuit element contact area even when said soft metal conductive layer has been deformed during testing.

7. The bonding pad structure of claim 2, wherein said hard metal layer comprises:

a refractory metal film selected from the group consisting of Mo, W, Cu, Ti, Ta, and Pt; and a refractory metal compound film selected from the group consisting of $MoSi_2$, $WSi_2$, CuSi, TiSi, PtSi, and TiN.

8. A bonding pad structure for receiving and electrically connecting an external bonding conductor to a contact area of a circuit element formed on a substrate of a semiconductor integrated circuit, comprising:

a first insulating layer patterned over the semiconductor integrated circuit substrate surrounding the circuit element contact area;

a hard metal conductive layer formed directly on said first insulating layer and electrically connected to the circuit element contact area;

a soft metal conductive layer formed on and extending contiguously with said hard metal conductive layer and electrically connected to the circuit element contact area via said hard metal conductive layer;

a second soft metal conductive layer contiguously interposing said hard metal conductive layer and said first insulating layer; and a second insulating layer patterned over said soft metal conductive layer, said second insulating layer defining an opening terminating at an upper surface of said soft metal conductive layer for receiving the external bonding conductor, wherein the external bonding conductor directly bonds to at least one of said hard metal and soft metal conductive layers and electrically connects with the circuit element contact area even when said soft metal conductive layer has been deformed during testing.

9. The bonding pad structure of claim 8, wherein said second soft metal conductive layer has a thickness ranging approximately from 1000 to 8000 Angstroms;

wherein said hard metal conductive layer has a thickness ranging approximately from 100 to 3000 Angstroms; and wherein said first soft metal conductive layer has a thickness ranging approximately from 4000 to 12,000 Angstroms.

10. A bonding pad structure for sequentially receiving and electrically connecting a test probe and an external bonding conductor to a contact area of a circuit element formed on a substrate of a semiconductor integrated circuit, comprising:

a first insulating layer patterned over the semiconductor integrated circuit substrate surrounding the circuit element contact area;

a hard metal conductive layer formed directly on said first insulating layer and electrically connected to the circuit element contact area, said hard metal layer having a substantially uniform, predetermined thickness;

a soft metal conductive layer formed on and extending contiguously with said hard metal conductive layer and electrically connected to the circuit element contact area via said hard metal conductive layer, said soft metal conductive layer having a relative thickness at least 1.5 times greater than the predetermined thickness of said hard metal conductive layer; and a second insulating layer patterned over said soft metal conductive layer, said second insulating layer defining an opening terminating at an upper surface of said soft metal conductive layer for receiving one of the test probe and the external bonding conductor, wherein the external bonding conductor directly bonds to at least one of said hard metal and soft metal conductive layers and electrically connects with the circuit element contact area even when the test probe has previously damaged said soft metal conductive layer during testing.

11. The bonding pad structure of claim 10, wherein said soft metal conductive layer comprises an aluminum film having a thickness ranging from approximately 5000 to 15,000 Angstroms; and wherein said hard metal conductive layer has a thickness ranging from approximately 100 to 3000 Angstroms.

12. The bonding pad structure of claim 10, wherein said soft metal conductive layer comprises an aluminum film.

13. The bonding pad structure of claim 10, wherein said soft metal conductive layer comprises an aluminum alloy film.

14. The bonding pad structure of claim 10, wherein said hard metal layer comprises a refractory film selected from the group consisting of Mo, W, Cu, Ti, Ta, Pt, $MoSi_2$, $WSi_2$, CuSi, TiSi, PtSi, and TiN.

15. A bonding pad structure for sequentially receiving and electrically connecting a test probe and an external bonding conductor to a contact area of a circuit element formed on a substrate of a semiconductor integrated circuit comprising:

a first insulating layer patterned over the semiconductor integrated circuit substrate surrounding the circuit element contact area;

a hard metal conductive layer formed directly on said first insulating layer and electrically connected to the circuit element contact area, said hard metal layer comprising:

a refractory metal film selected from the group consisting of Mo, W, Cu, Ti, Ta, and Pt; and a refractory metal compound film selected from the group consisting of $MoSi_2$, $WSi_2$, CuSi, TiSi, PtSi, and TiN;

a soft metal conductive layer formed on and extending contiguously with said hard metal conductive layer and electrically connected to the circuit element contact area via said hard metal conductive layer; and a second insulating layer patterned over said soft metal conductive layer, said second insulating layer defining an opening terminating at an upper surface of said soft metal conductive layer for receiving one of the test probe and the external bonding conductor, wherein the external bonding conductor directly bonds to at least one of said hard metal and soft metal conductive layers and electrically connects with the circuit element contact area even when the test probe has previously damaged said soft metal conductive layer during testing.

16. The bonding pad structure of claim 11, wherein said hard metal layer comprises:
   a refractory metal film selected from the group consisting of Mo, W, Cu, Ti, Ta, and Pt; and
   a refractory metal compound film selected from the group consisting of $MoSi_2$, $WSi_2$, CuSi, TiSi, PtSi, and TiN.

17. A bonding pad structure for sequentially receiving and electrically connecting a test probe and an external bonding conductor to a contact area of a circuit element formed on a substrate of a semiconductor integrated circuit, comprising:
   a first insulating layer patterned over the semiconductor integrated circuit substrate surrounding the circuit element contact area;
   a hard metal conductive layer formed directly on said first insulating layer and electrically connected to the circuit element contact area;
   a soft metal conductive layer formed on and extending contiguously with said hard metal conductive layer and electrically connected to the circuit element contact area via said hard metal conductive layer;
   a second soft metal conductive layer contiguously interposing said hard metal conductive layer and said first insulating layer; and
   a second insulating layer patterned over said soft metal conductive layer, said second insulating layer defining an opening terminating at an upper surface of said soft metal conductive layer for receiving one of the test probe and the external bonding conductor, wherein the external bonding conductor directly bonds to at least one of said hard metal and soft metal conductive layers and electrically connects with the circuit element contact area even when the test probe has previously damaged said soft metal conductive layer during testing.

18. The bonding pad structure of claim 17, wherein
said second soft metal conductive layer has a thickness ranging approximately from 1000 to 8000 Angstroms;
wherein said hard metal conductive layer has a thickness ranging approximately from 100 to 3000 Angstroms; and
wherein said first soft metal conductive layer has a thickness ranging approximately from 4000 to 12,000 Angstroms.

19. A semiconductor, comprising:
   a substrate;
   a circuit element formed on said substrate, said circuit element including an electrical contact area disposed on an upper surface thereof;
   a bonding conductor; and
   a bonding pad structure receiving said bonding conductor and electrically connecting said bonding conductor to said circuit element contact area, comprising:
      a first insulating layer patterned over the semiconductor integrated circuit substrate surrounding said circuit element contact area;
      a hard metal conductive layer formed directly on said first insulating layer and electrically connected to said circuit element contact area, said hard metal layer having a substantially uniform, predetermined thickness;
      a soft metal conductive layer formed on and extending contiguously with said hard metal conductive layer and electrically connected to said circuit element contact area via said hard metal conductive layer, said soft metal conductive layer having a relative thickness at least 1.5 times greater than the predetermined thickness of said hard metal conductive layer, and
      a second insulating layer patterned over said soft metal conductive layer, said second insulating layer defining an opening terminating at an upper surface of said soft metal conductive layer for receiving said bonding conductor, wherein said bonding conductor directly bonds to at least one of said hard metal and soft metal conductive layers and electrically connects to said circuit element contact area even when said soft metal conductive layer has been deformed during testing.

20. The semiconductor of claim 19, wherein
said soft metal conductive layer comprises an aluminum film having a thickness ranging from approximately 5000 to 15,000 Angstroms; and
wherein said hard metal conductive layer has a thickness ranging from approximately 100 to 3000 Angstroms.

21. The semiconductor of claim 19, wherein said soft metal conductive layer comprises an aluminum film.

22. The semiconductor of claim 19, wherein said soft metal conductive layer comprises an aluminum alloy film.

23. The semiconductor of claim 19, wherein said hard metal layer comprises a refractory film selected from the group consisting of Mo, W, Cu, Ti, Ta, Pt, $MoSi_2$, $WSi_2$, CuSi, TiSi, PtSi, and TiN.

24. A semiconductor, comprising:
   a substrate;
   a circuit element formed on said substrate, said circuit element including an electrical contact area disposed on an upper surface thereof;
   a bonding conductor; and
   a bonding pad structure receiving said bonding conductor and electrically connecting said bonding conductor to said circuit element contact area, comprising:
      a first insulating layer patterned over the semiconductor integrated circuit substrate surrounding said circuit element contact area;
      a hard metal conductive layer formed directly on said first insulating layer and electrically connected to said circuit element contact area, said hard metal layer comprising:
         a refractory metal film selected from the group consisting of Mo, W, Cu, Ti, Ta, and Pt; and
         a refractory metal compound film selected from the group consisting of $MoSi_2$, $WSi_2$, CuSi, TiSi, PtSi, and TIN;
      a soft metal conductive layer formed on and extending contiguously with said hard metal conductive layer and electrically connected to said circuit element contact area via said hard metal conductive layer; and
      a second insulating layer patterned over said soft metal conductive layer, said second insulating layer defining an opening terminating at an upper surface of said soft metal conductive layer for receiving said bonding conductor, wherein said bonding conductor directly bonds to at least one of said hard metal and soft metal conductive layers and electrically connects to said circuit element contact area even when said soft metal conductive layer has been deformed during testing.

25. The bonding pad structure of claim 20, wherein said hard metal layer comprises:
   a refractory metal film selected from the group consisting of Mo, W, Cu, Ti, Ta, and Pt; and a refractory metal compound film selected from the group consisting of $MoSi_2$, $WSi_2$, CuSi, TiSi, PtSi, and TiN.

26. A semiconductor, comprising:

a substrate;

a circuit element formed on said substrate, said circuit element including an electrical contact area disposed on an upper surface thereof;

a bonding conductor; and a bonding pad structure receiving said bonding conductor and electrically connecting said bonding conductor to said circuit element contact area, comprising:

a first insulating layer patterned over the semiconductor integrated circuit substrate surrounding said circuit element contact area;

a hard metal conductive layer formed directly on said first insulating layer and electrically connected to said circuit element contact area;

a soft metal conductive layer formed on and extending contiguously with said hard metal conductive layer and electrically connected to said circuit element contact area via said hard metal conductive layer;

a second soft metal conductive layer contiguously interposing said hard metal conductive layer and said first insulating layer; and a second insulating layer patterned over said soft metal conductive layer, said second insulating layer defining an opening terminating at an upper surface of said soft metal conductive layer for receiving said bonding conductor, wherein said bonding conductor directly bonds to at least one of said hard metal and soft metal conductive layers and electrically connects to said circuit element contact area even when said soft metal conductive layer has been deformed during testing.

27. The semiconductor of claim 26, wherein said second soft metal conductive layer has a thickness ranging approximately from 1000 to 8000 Angstroms;

wherein said hard metal conductive layer has a thickness ranging approximately from 100 to 3000 Angstroms; and wherein said first soft metal conductive layer has a thickness ranging approximately from 4000 to 12,000 Angsrtoms.

* * * * *

UNITED STATES PATENT AND TRADEMARK OFFICE
CERTIFICATE OF CORRECTION

PATENT NO.    : 5,719,448
DATED         : February 17, 1998
INVENTOR(S)   : Matsuo Ichikawa It is certified that errors appear in the above identified patent and that said Letters Patent is hereby corrected as shown below:

Column 14, line 48, change "TIN" to --TiN--.

Column 16, line 22, change "Angsrtoms" to --Angstroms--.

Signed and Sealed this

Second Day of June, 1998

Attest:

BRUCE LEHMAN

Attesting Officer

Commissioner of Patents and Trademarks